US007399666B2

(12) United States Patent
Ahn et al.

(10) Patent No.: US 7,399,666 B2
(45) Date of Patent: Jul. 15, 2008

(54) ATOMIC LAYER DEPOSITION OF $ZR_3N_4/ZRO_2$ FILMS AS GATE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/058,563

(22) Filed: Feb. 15, 2005

(65) Prior Publication Data
US 2006/0183272 A1    Aug. 17, 2006

(51) Int. Cl.
*H01L 21/336*    (2006.01)
(52) U.S. Cl. .................. 438/197; 438/240; 438/275; 438/785; 257/E21.051
(58) Field of Classification Search .................. 438/142, 438/3, 197, 198–240, 275–279, 778, 785; 257/E29.04, E21.051, E21.062
See application file for complete search history.

(56) References Cited

U.S. PATENT DOCUMENTS

| 5,572,052 | A | 11/1996 | Kashihara et al. |
|---|---|---|---|
| 5,698,022 | A | 12/1997 | Glassman et al. |
| 6,013,553 | A | 1/2000 | Wallace et al. |
| 6,020,243 | A | 2/2000 | Wallace et al. |
| 6,203,613 | B1 | 3/2001 | Gates et al. |
| 6,297,539 | B1 | 10/2001 | Ma et al. |
| 6,404,027 | B1 | 6/2002 | Hong et al. |
| 6,444,592 | B1 | 9/2002 | Ballantine et al. |
| 6,451,695 | B2 | 9/2002 | Sneh |
| 6,495,436 | B2 | 12/2002 | Ahn et al. |
| 6,514,828 | B2 | 2/2003 | Ahn et al. |

(Continued)

FOREIGN PATENT DOCUMENTS

EP    0540993 A1    5/1993

(Continued)

OTHER PUBLICATIONS

Ahn, Kie Y., et al., "Ald of Amorphous Lanthanide Doped Tiox Films", U.S. Appl. No. 11/092,072, filed Mar. 29, 2005.

(Continued)

*Primary Examiner*—Brook Kebede
(74) *Attorney, Agent, or Firm*—Schwegman, Lundberg & Woessner, P.A.

(57) ABSTRACT

The use of atomic layer deposition (ALD) to form a dielectric layer of zirconium nitride ($Zr_3N_4$) and zirconium oxide ($ZrO_2$) and a method of fabricating such a dielectric layer produces a reliable structure for use in a variety of electronic devices. Forming the dielectric structure includes depositing zirconium oxide using atomic layer deposition using precursor chemicals, followed by depositing zirconium nitride using precursor chemicals, and repeating. Alternatively, the zirconium nitride may be deposited first followed by the zirconium nitride, thus providing a different work function. Such a dielectric may be used as the gate insulator of a MOSFET, a capacitor dielectric, or a tunnel gate insulator in memories, because the high dielectric constant (high-k) of the film provides the functionality of a thinner silicon dioxide film, and because of the reduced leakage current of the physically thicker dielectric layer when compared to an electrically equivalent thickness of silicon dioxide.

28 Claims, 5 Drawing Sheets

U.S. PATENT DOCUMENTS

| | | | |
|---|---|---|---|
| 6,534,420 B2 | 3/2003 | Ahn et al. |
| 6,559,007 B1 | 5/2003 | Weimer |
| 6,608,378 B2 | 8/2003 | Ahn et al. |
| 6,617,639 B1 | 9/2003 | Wang et al. |
| 6,632,279 B1 | 10/2003 | Ritala et al. |
| 6,661,058 B2 | 12/2003 | Ahn et al. |
| 6,674,138 B1 | 1/2004 | Halliyal et al. |
| 6,699,747 B2 | 3/2004 | Ruff et al. |
| 6,737,309 B2 | 5/2004 | Matsuo |
| 6,767,582 B1 | 7/2004 | Elers |
| 6,767,795 B2 | 7/2004 | Ahn et al. |
| 6,770,923 B2 | 8/2004 | Nguyen et al. |
| 6,780,704 B1 | 8/2004 | Raaijmakers et al. |
| 6,787,413 B2 | 9/2004 | Ahn |
| 6,790,791 B2 | 9/2004 | Ahn et al. |
| 6,821,873 B2 | 11/2004 | Visokay et al. |
| 6,831,315 B2 | 12/2004 | Raaijmakers et al. |
| 6,844,203 B2 | 1/2005 | Ahn et al. |
| 6,884,739 B2 | 4/2005 | Ahn et al. |
| 6,893,984 B2 | 5/2005 | Ahn et al. |
| 6,900,122 B2 | 5/2005 | Ahn et al. |
| 6,921,702 B2 | 7/2005 | Ahn et al. |
| 6,958,302 B2 | 10/2005 | Ahn et al. |
| 6,960,538 B2 | 11/2005 | Ahn et al. |
| 6,979,855 B2 | 12/2005 | Ahn et al. |
| 6,989,565 B1 * | 1/2006 | Aronowitz et al. ......... 257/324 |
| 6,989,573 B2 | 1/2006 | Ahn et al. |
| 7,064,058 B2 | 6/2006 | Ahn et al. |
| 7,067,439 B2 | 6/2006 | Metzner et al. |
| 2001/0009695 A1 | 7/2001 | Saanila et al. |
| 2001/0030352 A1 | 10/2001 | Ruf et al. |
| 2002/0001971 A1 | 1/2002 | Cho |
| 2002/0037615 A1 | 3/2002 | Matsuo |
| 2002/0046705 A1 | 4/2002 | Sandhu et al. |
| 2002/0111001 A1 | 8/2002 | Ahn |
| 2002/0146916 A1 | 10/2002 | Irino et al. |
| 2002/0155688 A1 | 10/2002 | Ahn |
| 2002/0155689 A1 | 10/2002 | Ahn |
| 2002/0172768 A1 | 11/2002 | Endo et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2003/0003635 A1 | 1/2003 | Paranjpe et al. |
| 2003/0003702 A1 | 1/2003 | Ahn |
| 2003/0017717 A1 | 1/2003 | Ahn |
| 2003/0043637 A1 | 3/2003 | Forbes et al. |
| 2003/0045078 A1 | 3/2003 | Ahn et al. |
| 2003/0048666 A1 | 3/2003 | Eldridge et al. |
| 2003/0059535 A1 | 3/2003 | Luo et al. |
| 2003/0116804 A1 * | 6/2003 | Visokay et al. ............... 257/350 |
| 2003/0119246 A1 | 6/2003 | Ahn |
| 2003/0119291 A1 | 6/2003 | Ahn et al. |
| 2003/0132491 A1 | 7/2003 | Ahn |
| 2003/0157764 A1 | 8/2003 | Ahn et al. |
| 2003/0185980 A1 | 10/2003 | Endo |
| 2003/0207032 A1 | 11/2003 | Ahn et al. |
| 2003/0207540 A1 | 11/2003 | Ahn et al. |
| 2003/0227033 A1 | 12/2003 | Ahn et al. |
| 2003/0228747 A1 | 12/2003 | Ahn et al. |
| 2003/0232511 A1 | 12/2003 | Metzner et al. |
| 2004/0007171 A1 | 1/2004 | Ritala et al. |
| 2004/0023461 A1 | 2/2004 | Ahn et al. |
| 2004/0038554 A1 | 2/2004 | Ahn |
| 2004/0043541 A1 | 3/2004 | Ahn |
| 2004/0043569 A1 | 3/2004 | Ahn |
| 2004/0110348 A1 | 6/2004 | Ahn et al. |
| 2004/0110391 A1 | 6/2004 | Ahn et al. |
| 2004/0144980 A1 | 7/2004 | Ahn et al. |
| 2004/0164357 A1 | 8/2004 | Ahn et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0198069 A1 | 10/2004 | Metzner et al. |
| 2004/0214399 A1 | 10/2004 | Ahn et al. |
| 2004/0222476 A1 | 11/2004 | Ahn et al. |
| 2004/0262700 A1 | 12/2004 | Ahn et al. |
| 2005/0009370 A1 | 1/2005 | Ahn |
| 2005/0020017 A1 | 1/2005 | Ahn et al. |
| 2005/0023594 A1 | 2/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0026349 A1 | 2/2005 | Forbes et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0227442 A1 | 10/2005 | Ahn et al. |
| 2005/0277256 A1 | 12/2005 | Ahn et al. |
| 2005/0280067 A1 | 12/2005 | Ahn et al. |
| 2006/0003517 A1 | 1/2006 | Ahn et al. |
| 2006/0024975 A1 | 2/2006 | Ahn et al. |
| 2006/0043492 A1 | 3/2006 | Ahn et al. |
| 2006/0043504 A1 | 3/2006 | Ahn et al. |
| 2006/0046522 A1 | 3/2006 | Ahn et al. |
| 2006/0054943 A1 * | 3/2006 | Li et al. ...................... 257/266 |
| 2006/0125030 A1 | 6/2006 | Ahn et al. |
| 2006/0128168 A1 | 6/2006 | Ahn et al. |
| 2006/0189164 A1 | 8/2006 | Okabe et al. |
| 2006/0208215 A1 | 9/2006 | Metzner et al. |
| 2006/0281330 A1 | 12/2006 | Ahn et al. |
| 2007/0090440 A1 | 4/2007 | Ahn et al. |

FOREIGN PATENT DOCUMENTS

| | | |
|---|---|---|
| EP | 1096042 | 5/2001 |
| EP | 1124262 | 8/2001 |
| WO | WO-02/31875 | 4/2002 |

OTHER PUBLICATIONS

Ahn, Kie Y., et al., "Atomic Layer Deposited Hafnium Tantalum Oxide Dielectrics", U.S. Appl. No. 11/029,757, filed Jan. 5, 2005.

Ahn, Kie Y. et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Oxide Films", U.S. Appl. No. 10/931,533, filed Aug. 31, 2004.

Ahn, Kie Y., et al., "Atomic Layer Deposition of Hf3N4/HfO2 Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed Aug. 26, 2004.

Ko, Myoung-Gyun, et al., "High density plasma enhanced atomic layer deposition of lanthanum oxide for high-k gate oxide material", *207th Meeting of the Electrochemical Society*, (May 2005), 1 page.

Leskela, M., et al., "ALD precursor chemistry: Evolution and future challenges", *J. Phys. IV France*, 9, (1999),837-852.

Nakajima, et al., "Atomic-layer-deposited silicon-nitride/SiO2 stacked gate dielectrics for highly reliable p-metal-oxide-semiconductor filed-effect transistor", *Applied Physics Letters*, vol. 77, (Oct. 2000),2855-2857.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992), 84-89.

Becker, Jill S., "Atomic Layer Deposition of Insulating Hafnium and Zirconium Nitrides", *Chem. Mater. 16*, (2004), 3497-3501.

Bradley, D. C., "Metallo-organic Compounds Containing Metal-Nitrogen Bonds", *J. Chem Soc. (A)*, (1969), 980-984.

Bradley, D. C., "Metallo-organic Compounds containing metal-Nitrogen bonds", *J. Chem. Soc.*, (1960), 3859-3861.

Copel, M. et al., "Structure and stability of ultrathin zirconium oxide layers on Si(001)", *Applied Physics Letters*, 76(4), (Jan. 2000), 436-438.

Kukli, Kaupo, "Dielectric Properties of Zirconium Oxide Grown by Atomic Layer Deposition from Iodide Precursor", *Journal of The Electrochemical Society*, 148(12), (2001), F227-F232.

Ritala, Mikko, "Zirconium dioxide thin films deposited by ALE using zirconium tetrachloride as precursor", *Applied Surface Science*, 75, (Jan. 1994), 333-340.

Sneh, Ofer, et al., "Thin film atomic layer deposition equipment for semiconductor processing", *Thin Solid Films*, 402(1-2), (Jan. 2002), 248-261.

Zhang, H, "High permittivity thin film nanolaminates", *Journal of Applied Physics*, 87(4), (Feb. 2000), 1921-1924.

"Search Report for International Application No. PCT US2005 031159", (Jan. 13, 2006), 7 pgs.

Iwamoto, K., et al., "Advanced Layer-By-Layer Deposition and Annealing Process For High-Quality High-K Dielectrics Formation", *Electrochemical Society Proceedings* vol. 2003 (14), (2003), 265-272.

Ritala, M., et al., "Atomic layer deposition of oxide thin films with metal alkoxides as oxygen sources", *Science*, 288(5464), (Apr. 14, 2000), 319-321.

Lu, Xu-Bing, et al., "Structure and dielectric properties of amorphous $LaAlO_3$ and $LaAlO_xN_y$ films as alternative gate dielectric materials", *Journal of Applied Physics*, 94(2), (Jul. 15, 2003), 1229-1234.

U.S. Appl. No. 10/229,903 final office action mailed Mar. 25, 2004, 11 pgs.

U.S. Appl. No. 10/229,903 final office action mailed Mar. 8, 2006, 16 pgs.

U.S. Appl. No. 10/229,903 non-final office action mailed Oct. 27, 2005, 12 pgs.

U.S. Appl. No. 10/229,903 non-final office action mailed Oct. 30, 2003, 7 pgs.

U.S. Appl. No. 10/229,903 Response filed Jan. 27, 2006 to non-final office action mailed Oct. 27, 2005, 20 pgs.

U.S. Appl. No. 10/229,903 Response filed Jan. 30, 2004 to non-final office action mailed Oct. 30, 2003, 15 pgs.

U.S. Appl. No. 10/229,903 Response filed May 19, 2004 to final office action mailed Mar. 25, 2004, 20 pgs.

U.S. Appl. No. 10/229,903 Response filed May 8, 2006 to final office action mailed Mar. 8, 2006, 23 pgs.

U.S. Appl. No. 10/930,516 Non-Final Office Action mailed Mar. 8, 2007, 20 pgs.

U.S. Appl. No. 10/930,516 Response filed Jun. 8, 2007 to Non-Final Office Action mailed Mar. 8, 2007, 13 pgs.

* cited by examiner

ATOMIC LAYER DEPOSITION OF ZR$_3$N$_4$/ZRO$_2$ FILMS AS GATE DIELECTRICS

TECHNICAL FIELD

This application relates generally to semiconductor devices and device fabrication and, more particularly, to dielectric layers and their method of fabrication.

BACKGROUND

The semiconductor industry has a market driven need to reduce the size of devices such as transistors, and to thus increase the operational speed of the device as well as reduce the device power consumption. To reduce transistor size, the thickness of the silicon dioxide, SiO$_2$, gate dielectric is reduced in proportion to the shrinkage of the gate length. For example, a metal-oxide-semiconductor field effect transistor (MOSFET) would use a 1.5 nm thick SiO$_2$ gate dielectric for a gate length of less than 100 nm. This scaling of gate dielectric thickness may be the most difficult issue facing the production of the next generation of MOSFETs. These increasingly smaller, faster, lower power consumption and more reliable integrated circuits (ICs) will likely be used in manufacturing products such as processor chips, mobile telephones, and memory devices such as dynamic random access memories (DRAMs).

Currently, the semiconductor industry reduces (or scales down) all of the dimensions of its basic devices, such as the silicon based MOSFET, to achieve the required improved operation. As mentioned, this device scaling includes scaling the gate dielectric, which has primarily been formed of silicon dioxide (SiO$_2$). A thermally grown amorphous SiO$_2$ layer provides a good electrically and thermodynamically stable material, where the interface of the SiO$_2$ layer with underlying silicon provides a high quality interface as well as superior electrical isolation properties. However, continued scaling in microelectronic devices has created problems as the gate dielectric has become thinner, such as increased leakage currents passing through the gate dielectric. Thus there is a need to develop other dielectric materials for use as gate dielectrics, in particular dielectric materials with higher dielectric constants (k) than the relatively low k value of silicon dioxide.

SUMMARY

The above mentioned problems are addressed by the present invention and will be understood by reading and studying the following specification. An embodiment for a method for forming an electronic device includes forming a dielectric layer using an atomic layer deposition (ALD) technique to form a dielectric having zirconium nitride, Zr$_3$N$_4$, and zirconium oxide, ZrO$_2$. An embodiment includes forming an integrated circuit having a dielectric made using atomic layer deposition to form zirconium nitride layers and zirconium oxide layers, and having a conductive layer on the dielectric. Either the zirconium nitride or the zirconium oxide may be deposited first, and there may be single layers of each, or multiple layers of either or both materials. Another embodiment includes a method of forming a memory array having an atomic layer deposited dielectric formed of zirconium nitride and zirconium oxide, contacting a conductive layer and forming an address decoder coupled to the memory array.

Embodiments include structures for capacitors, transistors, memory devices, and electronic systems with dielectric layers containing an atomic layer deposited zirconium nitride and zirconium oxide dielectric, and methods for forming such structures. These and other aspects, embodiments, advantages, and features will become apparent from the following description and the referenced drawings.

DETAILED DESCRIPTION

Figure 1:
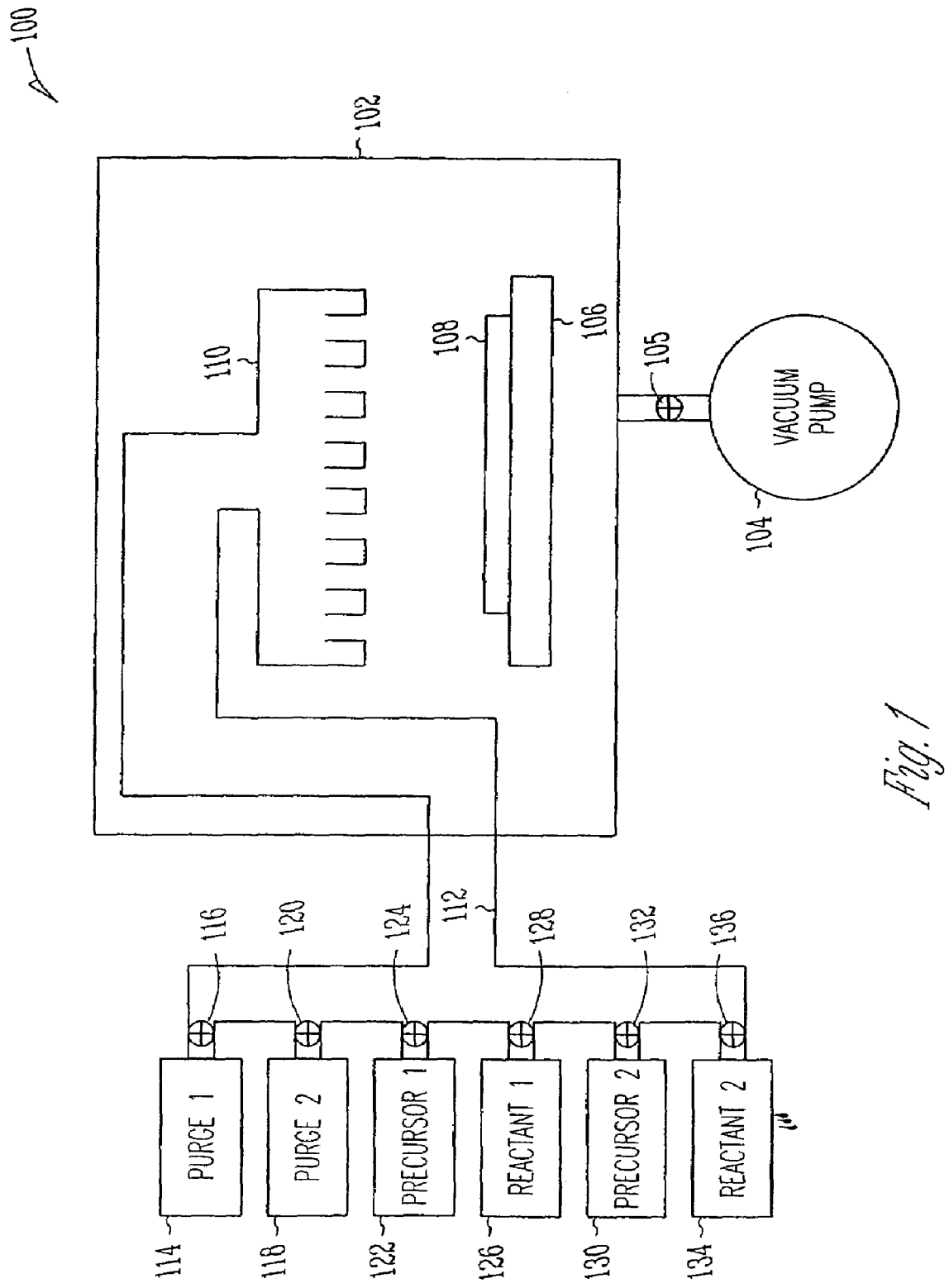
FIG. 1 depicts an atomic layer deposition system for fabricating a dielectric layer formed as a nanolaminate layered sequence of zirconium nitride and zirconium oxide, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over"

and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The scaling of the metal oxide semiconductor field effect transistor (MOSFET) to submicron feature sizes in order to increase operational speed, decrease power consumption and increase reliability, requires a corresponding reduction in the gate dielectric thickness. Although thermally grown amorphous silicon dioxide $SiO_2$ is currently the dielectric most often used in these applications, the thinner layers of silicon dioxide are developing reliability and performance issues. As the silicon dioxide thickness is reduced to about 2.5 nm, a large gate leakage current of up to one amp per square centimeter flows through the dielectric due to direct tunneling. Such a problem may occur in any dielectric material as the material thickness approaches tunneling thickness. To achieve the necessary large capacitance per unit area across the gate dielectric to control the electrical properties of the semiconductor material below the gate dielectric without using dielectric layers that are so thin as to potentially have large leakage currents, it is necessary to use thicker layers of dielectric materials having higher dielectric constant (k) values than silicon dioxide or silicon nitride. An additional advantage of several high k materials is the improved diffusion barrier preventing gate electrode dopants, such as boron and phosphorous, from entering the semiconductor below the gate dielectric.

Zirconium is elemental metal number 40, and is situated in the periodic table of elements next to niobium, well known for its use in superconductors, and right after yttrium, well known for its use in YAG type lasers. Zirconium is commonly used in nuclear fuel rods, arc welding rods, catalytic converters, and in its oxide form as jewelry and as high temperature bricks for furnace systems.

Zirconium nitride has a formula of $Zr_3N_4$ and a dielectric constant k of about 30. Zirconium nitride films can be atomic layer deposited using various homoleptic tetrakis(dialkylamino) metal (IV) complexes as precursors, such as $Zr[N(CH_3)(C_2H_5)]_4$, and ammonia, $NH_3$, at 150° C. to 250° C. deposition temperature. Other known types of tetrakis(dialkylamino) metal (IV) compounds may also be used, such as tetrakis dimethlyamine, $Zr[N(CH_3)_2]_4$, or tetrakis diethlyamine, $Zr[N(C_2H_5)_2]_4$. Zirconium nitride is a material having various stable formulae, including a widely known zirconium mononitride that is used as a diffusion barrier in semiconductor devices. This zirconium mononitride is shiny, gold colored and highly electrically conductive, thus making it useful as an impurity diffusion barrier between the metallization conductor material and the semiconductor substrate. The present zirconium nitride, having a formula of $Zr_3N_4$, is a higher order nitride and has different properties from the mononitride, such as being transparent, electrically insulating, and having a high dielectric constant, making it useful as a gate insulator. $Zr_3N_4$ is also thermally stable and may be annealed at temperatures of up to 900° C.

Zirconium oxide has a formula of $ZrO_2$, a dielectric constant k of from 19 to 24, a very high dielectric breakdown voltage of about 2 MeV, and a low leakage rate of about $1.1 \times 10^{-7}$ A/cm² at a 1 Mv/cm electric field strength. Zirconium oxide layers can be atomic layer deposited (ALD) using various precursors such as zirconium tetraiodide, $ZrI_4$, and a mixture of steam and hydrogen peroxide at temperatures between 325 to 500° C., or zirconium tetrachloride $ZrCl_4$, and steam at 275 to 325° C. Zirconium oxide layers may also be deposited using homoleptic tetrakis(dialkylamino) metal (IV) complexes and steam at deposition temperatures between 200 to 300° C. Water vapor mixed with hydrogen peroxide, oxygen gas or ozone may also be used as the reactant material forming the zirconium oxide.

In an embodiment the deposition temperature is between 275 to 325° C. The preparation of homoleptic tetrakis(dialkylamino) metal (IV) compounds may be synthesized from zirconium chloride and their various amine salts, as is well known in the chemical art.

Each of the zirconium oxide and zirconium nitride films may have a very tightly controlled thickness for each deposition cycle that depends on the saturation of the substrate surface. If repetitive layers of zirconium oxide are grown upon one another, then the single resulting film of zirconium oxide will have a thickness that is easily controlled by simply controlling the number of deposition cycles. The surface of the ALD layer formed is also very smooth and continuous, even over sharp underlying topography. One of the useful properties of ALD in forming dielectric layers is the high level of what is known as "step coverage", even over sharp edges and in trenches having aspect ratios of depth to width of 40 to 1. In an embodiment, the zirconium oxide layer has 100% step coverage over 90 degree angle steps.

The deposition cycles may also be alternated between the two different dielectrics, and the resulting film may either be a nanolaminate of the two, or more, different dielectrics, or the two, or more, dielectrics may form an alloy with each other if the similarity between the two or more dielectrics results in miscible materials. In either case the film properties may vary depending upon the ratio of the two or more different materials, and thus materials may be formed that have engineered properties. In an embodiment, to form a dielectric layer having an overall dielectric constant k value of about 25, deposit one layer of zirconium oxide and then one layer of zirconium nitride, and repeat until the desired overall dielectric thickness is achieved. In this way a material having a dielectric constant k of 19, such as zirconium oxide, may be combined with a material having a dielectric constant k of 30, such as zirconium nitride, to form a dielectric layer having the desired dielectric constant k of 25.

A composite dielectric layer of zirconium nitride and zirconium oxide may be beneficially used because the relatively high dielectric constant (high-k) of from 19 to 30 of the film (depending upon the ratio of zirconium oxide to zirconium nitride) as compared to 3.9 for silicon dioxide, provides the functionality of a much thinner silicon dioxide film without the reliability loss and leakage currents consequent to using such physically thin silicon dioxide films.

It is possible to use thicker layers of zirconium oxide and zirconium nitride to replace much thinner silicon dioxide layers without changing the electrical properties of the transistor because of the higher dielectric constant of the zirconium dielectrics. A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less.

Silicon dioxide is used as a gate dielectric, in part, due to its electrical isolation properties in a $SiO_2$—Si based structure. This electrical isolation is due to the relatively large band gap of $SiO_2$ (8.9 eV), which makes it a good insulator. Significant reductions in its band gap would eliminate it as a material for use as a gate dielectric. However, as the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a thicker or bulk layer. As a result of incomplete formation relative to a bulk structure, a thin $SiO_2$ layer of only one or two monolayers will not form a full band gap. The lack of a full band gap in a $SiO_2$ gate dielectric may cause an effective short between an underlying conductive silicon channel and an overlying polysilicon gate. This undesirable property sets a limit on the physical thickness to which a $SiO_2$ layer can be scaled. The minimum thickness due to this monolayer effect is thought to be about 7–8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C = k\epsilon_0 A/t$, where k is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $k_{ox} = 3.9$, as $$t = (k/k_{ox})t_{eq} = (k/3.9)t_{eq}.$$

Thus, materials with a dielectric constant greater than that of $SiO_2$ will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the future of the microelectronics industry still predicts silicon based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sub-layers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq} = t_{SiO_2} + (k_{ox}/k)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer directly in contact, or interfacing with the silicon layer must provide a high quality interface to maintain high channel carrier mobility.

One of the advantages of using $SiO_2$ as a gate dielectric has been that the formation of the $SiO_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Candidates to replace $SiO_2$ include high-k dielectric materials. High-k materials include materials having a dielectric constant greater than silicon dioxide, for example, dielectric materials having a dielectric constant greater than about twice the dielectric constant of silicon dioxide. An appropriate high-k gate dielectric should have a large energy gap ($E_g$) and large energy barrier heights with the silicon substrate for both electrons and holes. Generally, the band gap is inversely related to the dielectric constant for a high-k material, which lessens some advantages of the high-k material. A set of high-k dielectric candidates for replacing silicon oxide as the dielectric material in electronic components in integrated circuit includes the lanthanide oxides such as $Pr_2O_3$, $La_2O_3$, $Nd_2O_3$, $Sm_2O_3$, $Gd_2O_3$, $Dy_2O_3$, $Ce_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include various lanthanide silicates, hafnium oxide $HfO_2$, and the presently discussed zirconium oxide $ZrO_2$ and zirconium nitride $Zr_3N_4$. Such high dielectric constant layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current, in particular the leakage current caused by tunneling mechanisms.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere, and other particles cause damage. High energy impacts remove body region particles, creating pits. The surface of such a deposited layer may have a rough contour due to the rough interface at the body region.

In an embodiment, a dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited dielectric film may have an engineered transition with a substrate surface, or may be formed with many thin layers of different dielectric materials to enable selection of the dielectric constant to a value between that available from pure dielectric compounds.

ALD, which may be known as atomic layer epitaxy (ALE), is a modification of chemical vapor deposition (CVD) and may also be called "alternatively pulsed-CVD". In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed at the substrate surface, during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of the chemisorbed first precursor. Subsequent to the film growth reaction, reaction byproducts and precursor excess are purged from the reaction chamber. With a precursor chemistry where the precursors adsorb and aggressively react with each other on the substrate, one ALD cycle can be performed in less than one second in properly designed flow type reaction chambers. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films, and multilayer structures of these. There has also been considerable interest in the ALD growth of silicon and germanium films, but due to the difficult precursor chemistry, this has not been very successful.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors may be used, though evaporation rates may vary somewhat during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The use of highly reactive precursors in ALD may contrast with the precursors for conventional metallo-organic CVD (MOCVD) type reactions.

The by-products in the reaction should be gaseous in order to allow their easy removal from the reaction chamber during a purge stage. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In any ALD process, molecular precursors are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition per cycle, composition, and thickness. ALD sequences generally deposit less than a full layer of the deposited material (for example zirconium oxide) per deposition cycle. Typically, a deposition or growth rate of about 0.25 to about 2.00 Å per ALD cycle can be realized.

The advantages of ALD include continuity at an interface, avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. ALD processes allow for deposition control on the order of single monolayers and the ability to deposit monolayers of amorphous films.

A cycle of an ALD deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the fourth reactant's purging gas. In the case where the thickness of the first series of cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra thin layers of two or more different materials in a layered stack, where the layers are alternating layers of the different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two or more materials singly. A nanolaminate may also include several layers of one material formed by an ALD reaction either over or under a single layer of a different material formed by another type of reaction, such as a MOCVD reaction. The layers of different materials may remain separate after deposition, or they may react with each other to form an alloy layer.

In an embodiment, a nanolaminate layer of zirconium oxide is formed on a substrate mounted in a reaction chamber using ALD. Alternatively, multiple layers may be formed in a repetitive sequence using precursor gases individually pulsed into the reaction chamber. An embodiment includes forming the zirconium nitride layers using a precursor gas such as zirconium tetrakisdimethylamine, having a chemical formula of $Zr[N(CH_4)_2]_4$, and a reactant of ammonia $NH_3$ at deposition temperatures as low as 150 to 250° C. An embodiment includes forming the zirconium oxide layers using a zirconium tetraiodide $ZrI_4$, and a reactant of water vapor and hydrogen peroxide at a deposition temperature of between 325 to 500° C. Another embodiment includes, for zirconium oxide, using zirconium tetrachloride $ZrCl_4$, and a reactant of steam at about 300° C. Other solid or liquid precursors may be used in an appropriately designed reaction chamber. The use of such precursors in an ALD reaction chamber may result in lower deposition temperatures in the range of 150 to 350° C. for both materials, and the ability to use mildly oxidizing reactant materials such as $H_2O$, $H_2O_2$, various alcohols, $N_2O$, $NH_3$, ozone or oxygen. Purge gases may include nitrogen, helium, argon or neon. Such films may survive high temperature anneals (sometimes used to reduce fixed surface state charges and improve metal to semiconductor resistance) of up to 1000° C., and have low leakage currents of less than $1.1 \times 10^{-7}$ A/cm$^2$ at electric field strengths of one MVolt/cm.

FIG. 1 shows an embodiment of an atomic layer deposition system 100 for forming a dielectric film containing zirconium nitride and zirconium oxide. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to as a showerhead, react with the substrate 108, and any excess gas and reaction products are removed from chamber 102 using vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas either by storing the precursor as a gas or by providing for evaporating a solid or liquid material to form the selected precursor gas.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternately, as required for the particular desired result. Furthermore, additional purging gas sources can be constructed in ALD system 100, one purging gas source for each different precursor and reactant gas, for example. For a process that uses the same purging gas for multiple precursor gases fewer purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for depositing $ZrO_2$ and $Zr_3N_4$ films, other commercially available ALD systems may also be used.

The use, construction and operation of reaction chambers for deposition of films are understood by those of ordinary skill in the art of semiconductor fabrication. A variety of such commercially available reaction chambers may be used. Furthermore, one of ordinary skill in the art will comprehend the necessary detection, measurement, and control techniques in the art of semiconductor fabrication upon reading and understanding the disclosure.

The elements of ALD system 100 may be controlled by a computer. To focus on the use of ALD system 100 the computer is not shown. Those skilled in the art can appreciate that the individual elements such as pressure control, temperature control, and gas flow within ALD system 100 can be under computer control.

Figure 2:
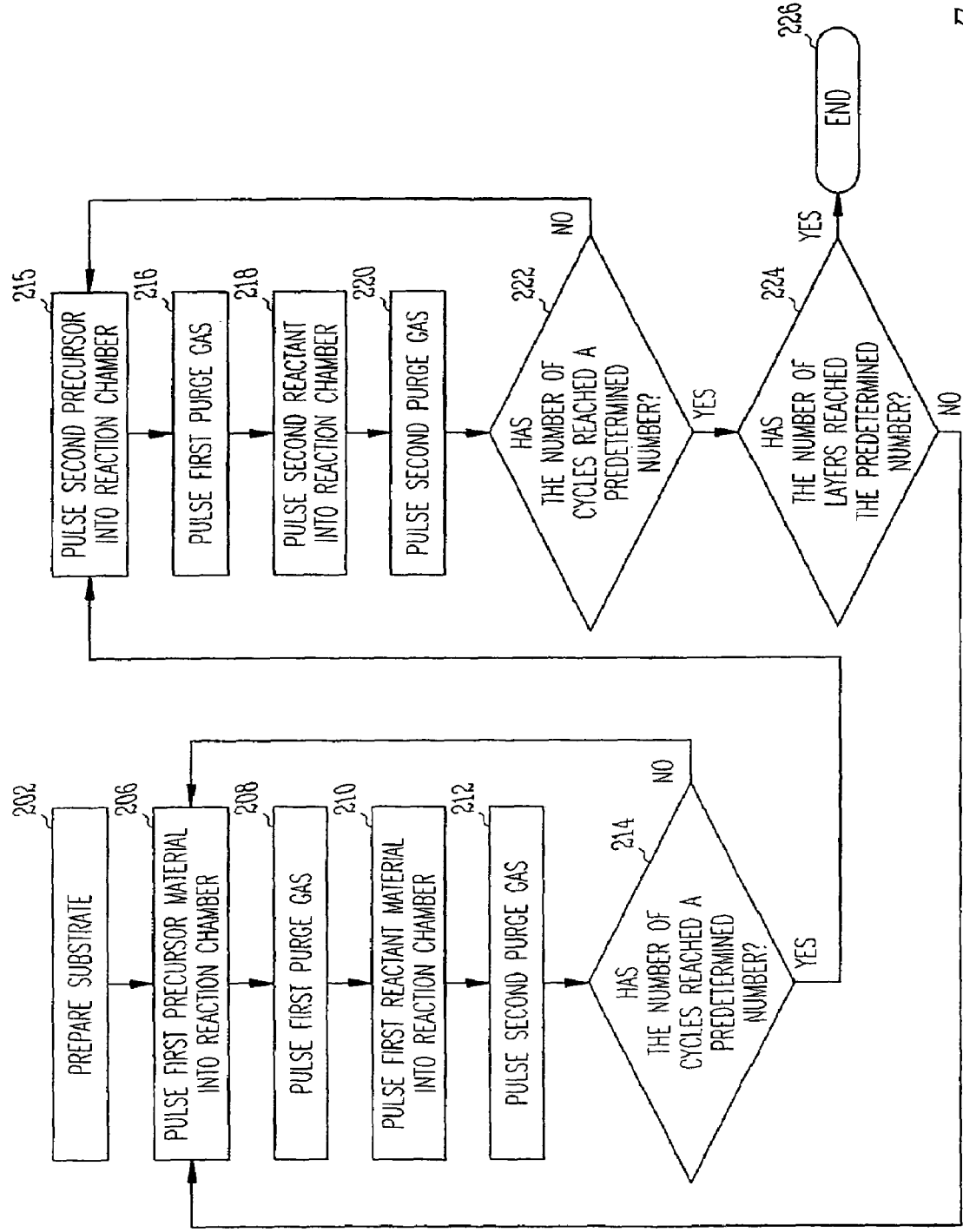
FIG. 2 illustrates a flow diagram of elements for an embodiment of a method to form a dielectric layer containing zirconium nitride and zirconium oxide using atomic layer deposition according to various embodiments.

FIG. 2 illustrates a flow diagram of operational steps for an embodiment of a method to form a nanolaminate dielectric layer containing zirconium nitride layers alternating with zirconium oxide layers in various ways, such as nine layers of zirconium oxide and nine layers of zirconium nitride, which pattern may be repeated until a film of a desired thickness is formed. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or a sputter etch in the reaction chamber 102. At 206 a first precursor material enters the reaction chamber for a predetermined length of time, for example 0.5–2.0 seconds. The first precursor material is chemically adsorbed onto the surface of the substrate, the amount depending upon the temperature of the substrate, in one embodiment 250° C., and the presence of sufficient flow of the precursor material. In addition, the pulsing of the precursor may use a pulsing period that provides uniform coverage of a chemisorbed monolayer on the substrate surface, or may use a pulsing period that provides partial formation of a monolayer on the substrate surface.

At 208 a first purge gas enters the reaction chamber for a predetermined length of time sufficient to remove substantially all of the non-chemisorbed first precursor material. Typical times may be 1.0–2.0 seconds with a purge gas comprising nitrogen, argon, neon, combinations thereof, or other gases such as hydrogen. At 210 a first reactant gas enters the chamber for a predetermined length of time, sufficient to provide enough of the reactant to chemically combine with the amount of chemisorbed first precursor material on the surface of the substrate. Typical reactant materials include mildly oxidizing materials, including, but not limited to, water vapor, hydrogen peroxide, nitrogen oxides, ammonia, ozone and oxygen gas, and combinations thereof. At 212 a second purge gas, which may be the same or different from the first purge gas, enters the chamber for a predetermined length of time, sufficient to remove substantially all non-reacted materials and any reaction byproducts from the chamber.

At 214 a decision is made as to whether or not the thickness of the first dielectric material in the dielectric has reached the desired thickness, or whether another deposition cycle is required. If another deposition cycle is needed, then the operation returns to 206, until the desired first dielectric layer is completed, at which time the process moves on to the deposition of the second material at 215. At 215 a second precursor material enters the reaction chamber for a predetermined length of time, typically 0.5–2.0 seconds. The second precursor material is chemically adsorbed onto the surface of the substrate, which in this case is the top surface of the first dielectric material, the amount of the chemical absorbed being dependent upon the temperature of the substrate, and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases shown. The purge cycle continues for a predetermined length of time sufficient to remove substantially all of the non-chemisorbed second precursor material.

At 218 a second reactant gas, which may the same or different from the first reactant gas, enters the chamber for a predetermined length of time, sufficient to provide enough of the reactant to chemically combine with the amount of chemisorbed second precursor material on the surface of the substrate. At 220 another purge gas enters the chamber, which may be the same or different from any of the three previously discussed purge gases, for a predetermined length of time, sufficient to remove substantially all non-reacted materials and any reaction byproducts from the chamber.

At 222 a decision is made as to whether or not the thickness of the second dielectric material in the nanolaminate dielectric has reached the desired thickness, or whether another deposition cycle is required. If another deposition cycle is needed, then the operation returns to 215, until the desired second dielectric layer is completed. The desired thicknesses of the first and second dielectric materials in the dielectric may not be the same thickness, and there may be more deposition cycles for one dielectric material as compared to the other. If the second dielectric layer has reached the desired thickness, the process moves on to a decision at 224 as to whether the number of layers of the first and second dielectric materials has reached the desired number. In this illustrative embodiment, a single layer of the first dielectric having a desired thickness, and a single layer of the second dielectric having a desired thickness, have been completed at this point in the process. If more than a single layer of each dielectric material is desired, the process moves back to another deposition of the first dielectric material at 206. After the number of interleaved layers of dielectrics one and two has reached the desired value, the deposition ends at 226. Because the dielectric values of the ALD oxides in the described embodiment are high, for example zirconium oxide may have a dielectric constant of 17 and zirconium nitride may have a dielectric constant of 30, and because the highly controlled layer thickness may be a single monolayer for each one of the interleaved dielectric layers, the physical thickness needed to obtain the equivalent dielectric properties of a very thin silicon dioxide layer may have from two to ten layers of each of the two dielectric materials described in the embodiments.

The embodiments described herein provide a process for growing a dielectric film having a wide range of useful equivalent oxide thicknesses, $t_{eq}$, associated with a dielectric constant in the range from about 19 to about 30. For an acceptable equivalent silicon dioxide thickness, an embodiment for a zirconium nitride and zirconium oxide may have a physical thickness that is more than four times larger than the equivalent silicon dioxide thickness, providing enhanced probability for reducing leakage current, especially due to tunneling mechanisms. Additionally, the novel process can be implemented to form transistors, capacitors, memory devices, and other electronic systems including information handling devices. The present subject matter is not limited to two dielectric materials, and the equipment described in FIG. 1 could have included a precursor and reactant 3, 4, which are not described for simplicity.

Figure 3:
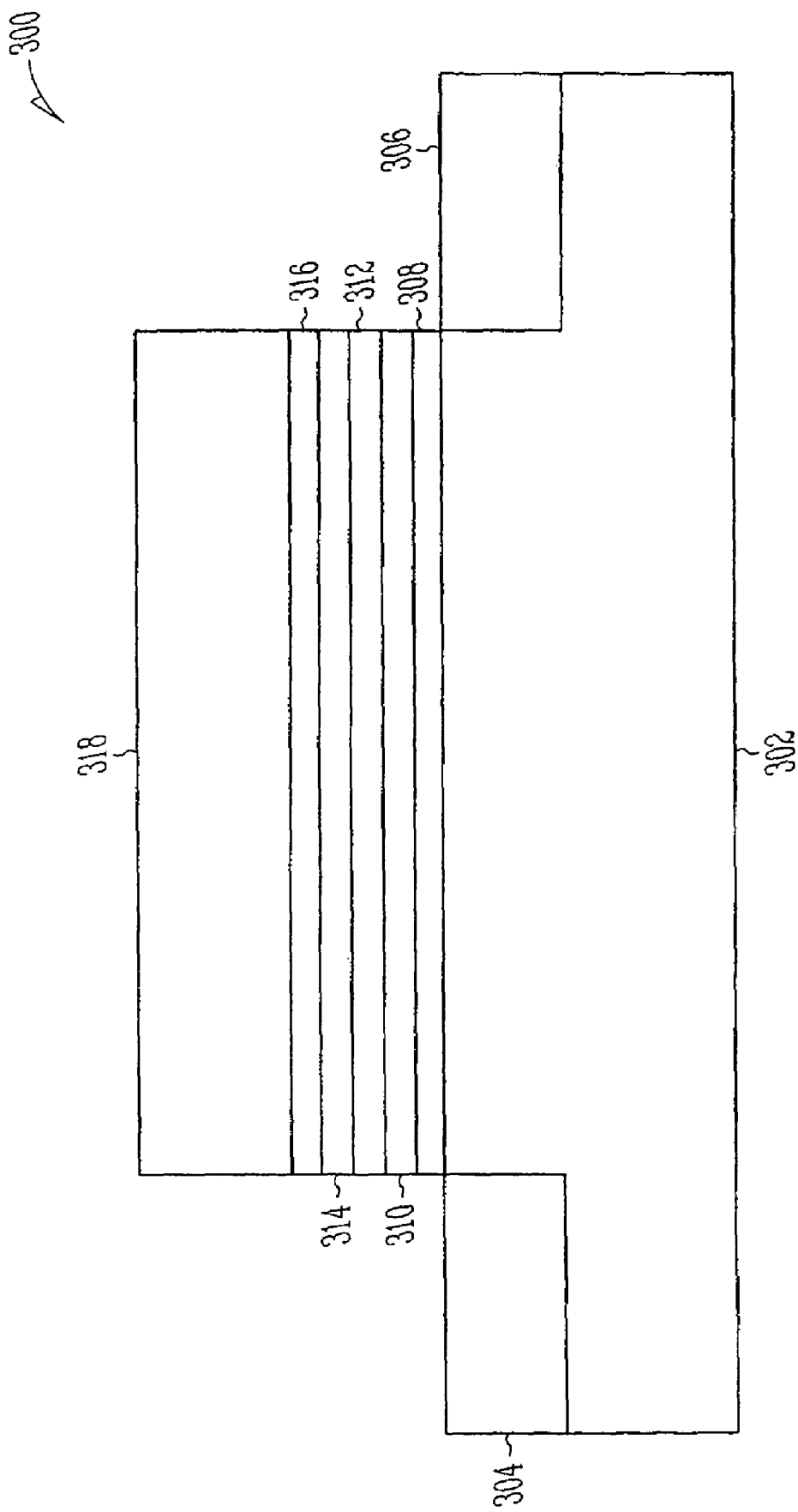
FIG. 3 illustrates an embodiment of a configuration of a transistor having a dielectric layer containing an atomic layer deposited dielectric layer containing zirconium nitride and zirconium oxide.

FIG. 3 illustrates a single transistor in an embodiment of a method to form a dielectric layer containing an ALD deposited zirconium nitride and zirconium gate oxide dielectric layer. This embodiment may be implemented with the system 100 of FIG. 1 used as an atomic layer deposition system. A substrate 302 is prepared, typically a silicon or silicon-containing material. In other embodiments, germanium, gallium arsenide, silicon-on-sapphire substrates, or other suitable substrates may also be used. The preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer. Cleaning immediately preceding atomic layer deposition aids in reducing an occurrence of silicon oxide as an interface between the silicon based substrate and the dielectric formed using the atomic layer deposition process. The sequencing of the formation of the regions of the transistor being processed may follow the generally understood fabrication of a MOS transistor as is well known to those skilled in the art.

The dielectric covering the area on the substrate 302 between the source and drain diffused regions 304 and 306 may be deposited by ALD in this illustrative embodiment, and may comprise one or more zirconium oxide layers 310 and 314, each potentially formed of many individual zirconium oxide layers, in an illustrative example, nine layers. There are also shown interleaved zirconium nitride layers 308, 312 and 316. Alternatively, there may be other combinations of interleaved and non-interleaved layers of varying thickness and deposition method. This nanolaminate dielectric layer is referred to as the gate oxide, and while shown as distinct and individual layers for clarity, may also be a single alloyed layer. There may be a diffusion barrier layer inserted between the first dielectric layer 308 and the substrate 302 to prevent metal contamination from affecting the electrical properties of the device. The illustrative embodiment shows the zirconium oxide layers 310 and 314 having the same thickness; however, the desired dielectric properties of the overall dielectric film may be best achieved by adjusting the ratio of the thickness of the two shown dielectric layers to different values. The lowest dielectric in this illustrative example is a zirconium nitride layer, but the embodiments are not so limited, and zirconium oxide may be made the lowest layer. The transistor 300 has a conductive material forming a gate 318 in this illustrative embodiment, but the dielectric may also be used in a floating gate device such as an EEPROM transistor, as either one or both of the floating gate and the control gate oxide layers. The conductive material may be polysilicon or various metals.

In an illustrative embodiment, the gate dielectric (layers 308–316) includes a tunnel gate insulator and a floating gate dielectric in a flash memory device. Use of dielectric layers containing an atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
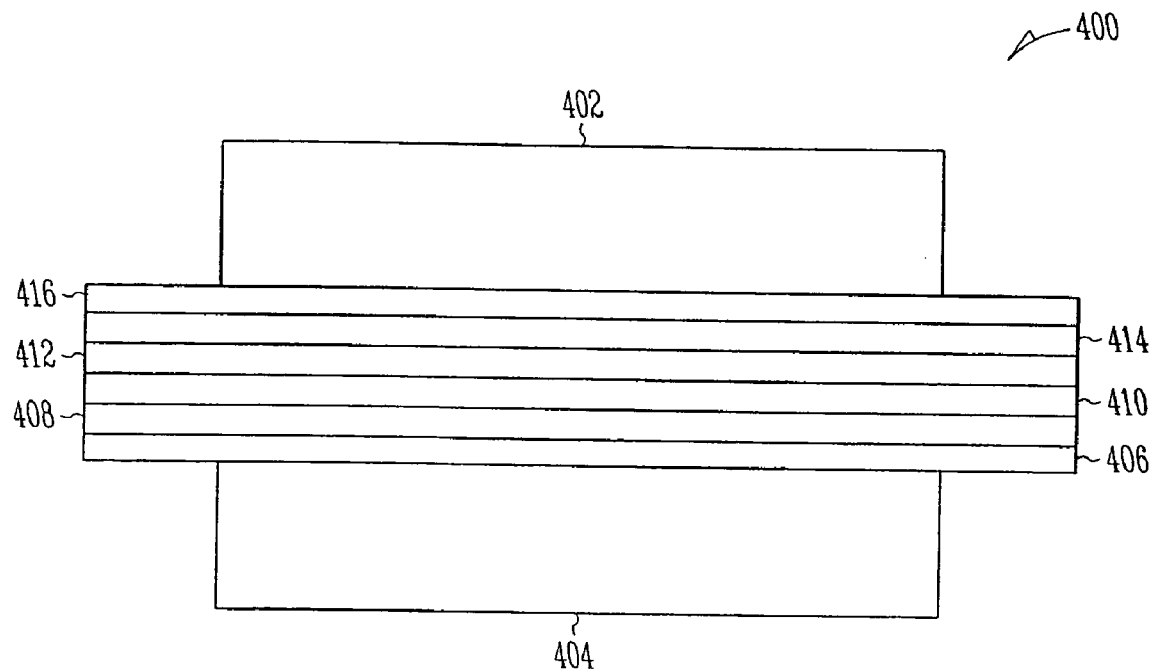
FIG. 4 shows an embodiment of a configuration of a capacitor having a dielectric layer containing an atomic layer deposited zirconium nitride and zirconium oxide.

The embodiments of methods for forming dielectric layers containing an ALD deposited dielectric layer contacting a conductive layer may also be applied to forming capacitors in various integrated circuits, memory devices, and electronic systems. In an embodiment including a capacitor 400 illustrated in FIG. 4, a method includes forming a first conductive layer 402, a second conductive layer 404, having a dielectric having interleaved layers 406–416 of two or more different dielectric materials, such as zirconium oxide and zirconium nitride, formed between the two conductive layers. The conductive layers 402 and 404 may include metals, doped polysilicon, silicided metals, polycides, or conductive organic compounds, without affecting the teachings of this embodiment. The sequencing and thickness of the individual dielectric layers 406–416 depends on the application and may include a single layer of each material, one layer of one of the materials and multiple layers of the other, or other combinations of layers including different layer thicknesses. By selecting each thickness and the composition of each layer, a nanolaminate structure can be engineered to have a predetermined dielectric constant and composition. In an embodiment, the total thickness of layers 408, 412 and 416 is equal to the thickness of layers 406, 410 and 414, providing a 50% combination of a first material (for example zirconium nitride) and a second material (for example zirconium oxide) and resulting in a dielectric layer having a dielectric constant k about halfway between the dielectric constant 19 of zirconium oxide and the dielectric constant 30 of zirconium nitride. Although the dielectric layers are shown in this illustrative example as being distinct layers, the oxide may be alloyed together to form a single material layer. Structures such as the nanolaminate structure shown in FIGS. 3 and 4 may be used in NROM flash memory devices as well as other integrated circuits. Transistors, capacitors, and other devices having dielectric films may be implemented into memory devices and electronic systems including information handling devices. Embodiments of these information handling devices include wireless systems, telecommunication systems, computers and integrated circuits.

Figure 5:
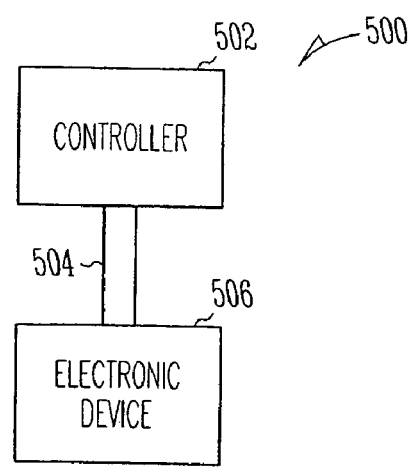
FIG. 5 is a simplified diagram of an embodiment of a controller coupled to an electronic device containing an atomic layer deposited nanolaminate layered sequence of zirconium nitride and zirconium oxide.

FIG. 5 illustrates a diagram for an electronic system 500 having one or more devices having a dielectric layer containing an atomic layer deposited dielectric layer formed according to various embodiments. Electronic system 500 includes a controller 502, a bus 504, and an electronic device 506, where bus 504 provides electrical conductivity between controller 502 and electronic device 506. In various embodiments, controller 502 and/or electronic device 506 includes an embodiment for a dielectric layer containing an ALD deposited dielectric layer as previously discussed herein. Electronic system 500 may include, but is not limited to, information handling devices, wireless systems, telecommunication systems, fiber optic systems, electro-optic systems, and computers.

Figure 6:
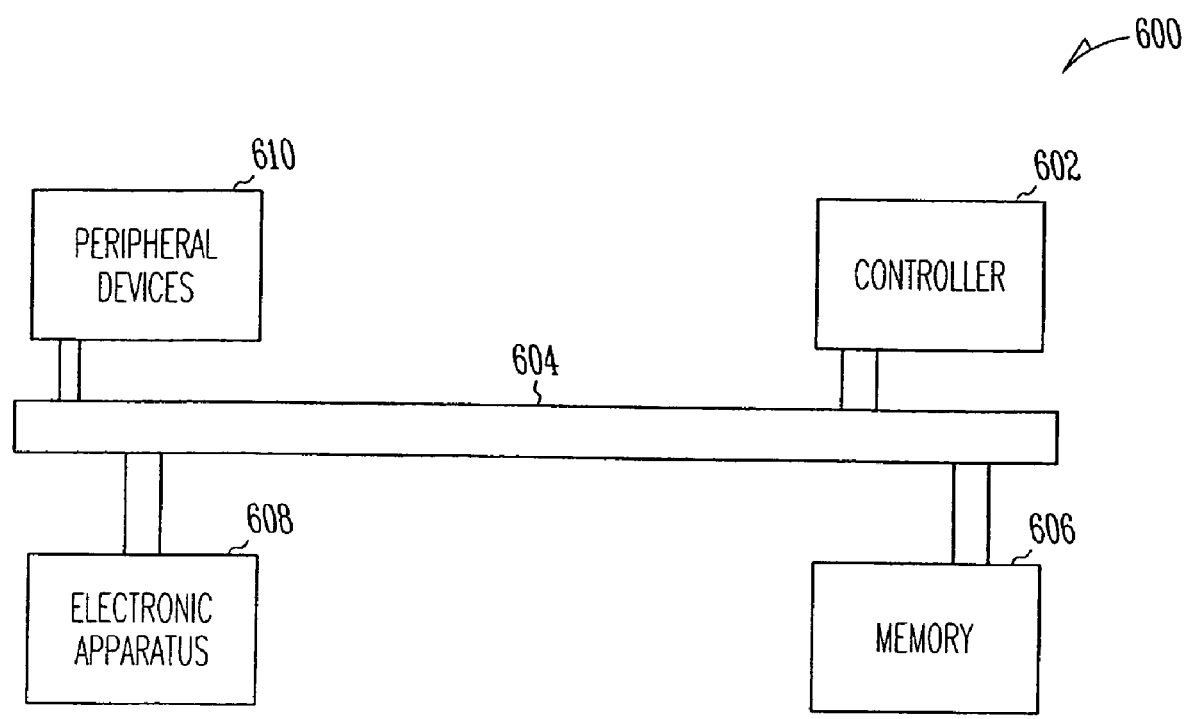
FIG. 6 illustrates a diagram of an embodiment of an electronic system having devices with a dielectric film containing an atomic layer deposited nanolaminate dielectric layer having a layered sequence of zirconium nitride and zirconium oxide.

FIG. 6 depicts a diagram of an embodiment of a system 600 having a controller 602 and a memory 606. Controller 602 and/or memory 606 includes a dielectric layer having an ALD dielectric layer. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a dielectric layer having an ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Formation of zirconium oxide layers using ALD deposition may be realized using a tetraiodide or a tetrachloride precursor chemical, and an oxidizing reactant, such as water vapor mixed with hydrogen peroxide. Zirconium nitride layers using ALD deposition may be realized using a tetrakisdialkylamine precursor chemical, and a reactant such as ammonia. Further, such dielectric films may be formed by ALD reactions processed at relatively low temperatures, such as 250° C., may be amorphous and possess smooth surfaces. Such ALD dielectric films may provide enhanced electrical properties as compared to physical deposition methods, such as sputtering or typical chemical layer depositions, due to their smoother surface, and reduced damage, resulting in reduced leakage current. Additionally, such dielectric layers provide a significantly thicker physical thickness than a silicon oxide layer having the same electrical equivalent oxide thickness, where the increased thickness may also reduce leakage current issues. These properties of ALD deposited dielectric layers allow for application as dielectric layers in electronic devices and systems.

Dielectric layers formed from zirconium nitride and zirconium oxide have beneficial properties for gate dielectrics and capacitor dielectric materials including thermal stability up to 900° C., high dielectric constant and low leakage currents. The conductive layers contacting the dielectric may include metals, semiconductor materials, polycrystalline semiconductor materials and doped materials of either conductivity type.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited zirconium oxide are formed having a dielectric constant (k) substantially higher than that of silicon oxide, such that these dielectric films possess an equivalent thickness, $t_{eq}$, thinner than $SiO_2$ gate dielectrics of the same physical thickness. Alternatively, the high dielectric constant relative to silicon dioxide allows the use of much larger physical thicknesses of these high-k dielectric materials for the same $t_{eq}$ of $SiO_2$. Films having relatively larger physical thickness aids in processing gate dielectrics in electronic devices and improves the electrical properties of the dielectrics.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the embodiments of the present invention should be determined with reference to the appended claims, along with the full scope of equivalents to which such claims are entitled.

What is claimed is:

1. A method comprising:
   forming a dielectric layer on a substrate containing at least one zirconium oxide dielectric layer and at least one zirconium nitride dielectric layer using atomic layer deposition; and forming an electrically conductive layer on the dielectric layer;
   wherein forming the dielectric layer includes forming an amorphous dielectric including $ZrO_2$ and $Zr_3N_4$, and combinations thereof.

2. The method of claim 1, wherein the substrate includes a conductive layer disposed below the dielectric layer.

3. The method of claim 2, wherein the method is a method of forming a capacitive device.

4. The method of claim 1, wherein the substrate includes at least two diffused regions having a first conductivity type, separated by a region of a second conductivity type disposed below the dielectric layer.

5. The method of claim 4, wherein the method is a method of forming a transistor device.

6. The method of claim 4, wherein the method is a method of forming a memory device.

7. The method of claim 1, wherein the at least one zirconium oxide layer is comprised of a plurality of individually deposited zirconium oxide layers, and each individual one of the zirconium oxide layers is less than or equal to two monolayers in thickness.

8. The method of claim 7, wherein each individual one of the zirconium oxide layers is a continuous monolayer and has a step coverage of greater than 90% over 90 degree angle steps.

9. The method of claim 7, wherein each individual one of the zirconium oxide layers has a thickness within a range from 1.3 to 1.5 Angstroms.

10. The method of claim 1, wherein the dielectric layer has a root mean square surface roughness that is less than one tenth of the layer thickness.

11. The method of claim 1, wherein a ratio of a thickness of zirconium oxide to a thickness of zirconium nitride is selected to result in a dielectric constant of the dielectric film of greater than 20.

12. The method of claim 1, wherein the dielectric film is separated from the substrate by a diffusion barrier.

13. The method of claim 1, wherein the dielectric film is formed at a temperature of between 275° C. to 325° C.

14. A method comprising:
   forming a dielectric layer on a substrate containing at least one zirconium oxide layer and at least one zirconium nitride layer using atomic layer deposition; and
   forming an electrically conductive layer on the dielectric layer;
   wherein the dielectric layer includes:
      exposing an activated substrate surface at a preselected temperature to a first precursor material for a preselected first time period and a preselected flow volume of the first precursor material to saturate the substrate surface with the first precursor material;
      exposing the substrate surface to a preselected volume of a first purge material for a preselected second time period to remove substantially all of a non-adsorbed portion of the first precursor material from the substrate surface;
      exposing the substrate surface to a preselected volume of a first reactant material for a preselected third time period to react with the adsorbed portion of the first precursor material on the substrate surface to form a first dielectric material having a first intermediate thickness to complete a first deposition cycle;
      exposing the substrate surface to a preselected volume of a second purge material for a preselected fourth time period to remove substantially all of a non-reacted portion of the first reactant material, and a first plurality of gaseous reaction byproducts from the substrate surface;
      repeating the first deposition cycle until a preselected final first dielectric material thickness is obtained;

exposing the substrate surface to a second precursor material for a preselected fifth time period and a preselected flow volume of the second precursor material to saturate the substrate surface with the second precursor material;

exposing the substrate surface to a preselected volume of a third purge material for a preselected sixth time period to remove substantially all of a non-adsorbed portion of the second precursor material from the substrate surface;

exposing the substrate surface to a preselected volume of a second reactant material for a preselected seventh time period to react with the adsorbed portion of the second precursor material on the substrate surface to form a second dielectric material having a second intermediate thickness to complete a second deposition cycle;

exposing the substrate surface to a preselected volume of a fourth purge material for a preselected eighth time period to remove substantially all of a non-reacted portion of the second reactant material, and a second plurality of gaseous reaction byproducts from the substrate surface; and repeating the second deposition cycle until a preselected final second dielectric material thickness is obtained.

15. The method of claim 14, wherein the process of forming the final first dielectric film thickness and the final second dielectric thickness is repeated to form multiple interleaved layers of the first and second dielectric films having a preselected overall dielectric film thickness and dielectric constant.

16. The method of claim 14, wherein the first dielectric film comprises zirconium oxide, the first precursor includes $ZrI_4$, the first reactant includes water vapor and hydrogen peroxide, and the deposition temperature is between 325° C. to 500° C.

17. The method of claim 14, wherein the first dielectric film comprises zirconium oxide, the first precursor includes $ZrCl_4$, the second precursor includes water vapor, and the deposition temperature is approximately 300° C.

18. The method of claim 14, wherein the second dielectric film comprises zirconium nitride, the second precursor includes $Zr[N(CH_3)_2]_4$, the second reactant includes ammonia ($NH_3$), and the deposition temperature is approximately 250° C.

19. The method of claim 14, wherein the zirconium nitride and zirconium oxide film are each a continuous layer having a root mean square surface roughness of less than 5 angstroms and a current leakage rate of less than $1.1 \times 10_{-7}$ amps per $cm^2$ at an electric field strength of 1 megavolt per cm.

20. A method comprising:

forming an integrated circuit having a dielectric layer containing at least one zirconium oxide dielectric layer and at least one zirconium nitride dielectric layer including performing atomic layer deposition; and forming a conductive layer on the dielectric layer;

wherein the conductive layer comprises a metal; and wherein the method further includes:

forming metallization lines in the metal layer to electrically connect to a device in the integrated circuit; and annealing the device in a $H_2$ ambient after forming the metallization lines.

21. The method of claim 20, wherein the method includes forming the dielectric layer as a gate insulator having a portion of the metal layer as a gate of a transistor in the integrated circuit.

22. The method of claim 21, wherein the method includes forming the dielectric layer as a gate insulator in a CMOS transistor in the integrated circuit.

23. The method of claim 21, wherein the method includes forming the metal layer as an electrode of a capacitor and forming the dielectric layer as a dielectric of the capacitor.

24. A method comprising:

forming an integrated circuit having a dielectric layer containing at least zirconium oxide dielectric and zirconium nitride dielectric using atomic layer deposition; and forming a conductive layer on the dielectric layer;

wherein the atomic layer deposition of the zirconium nitride includes a precursor comprising homoleptic(tetrakisdialkyloamido)metal(IV) complexes of zirconium and ammonia at a temperature of between 150° C. to 250° C.

25. The method of claim 24, wherein the atomic layer deposition of the zirconium oxide includes a precursor comprising homoleptic (tetrakisdialkyloamido)metal(1V) complexes of zirconium and water vapor at a temperature of between 200° C. to 300° C.

26. The method of claim 24, wherein the homoleptic (tetrakisdialkyloamido) metal(IV) complex of zirconium comprises at least one of $Zr[N(CH_3)_2]_4$, $Zr[N(C_2H_5)_2]_4$, and $Zr[N(CH_3)(C_2H_5)]_4$.

27. The method of claim 25, wherein the homoleptic (tetrakisdialkyloamido) metal(JV) complex of zirconium comprises $Zr[N(CH_3)(C_2H_5)]_4$.

28. The method of claim 24, wherein the atomic layer deposition of the zirconium oxide includes a precursor comprising zirconium tetrachloride and water vapor at a temperature of between 275° C. to 325° C.

* * * * *

UNITED STATES PATENT AND TRADEMARK OFFICE
CERTIFICATE OF CORRECTION

PATENT NO. : 7,399,666 B2  Page 1 of 1
APPLICATION NO. : 11/058563
DATED : July 15, 2008
INVENTOR(S) : Ahn et al.

It is certified that error appears in the above-identified patent and that said Letters Patent is hereby corrected as shown below:

On the face page, in field (54), in "Title", in column 1, line 2, delete "$ZR_3N_4/ZRO_2$" and insert -- $Zr_3N_4/ZrO_2$ --, therefor.

In column 1, line 2, delete "$ZR_3N_4/ZRO_2$" and insert -- $Zr_3N_4/ZrO_2$ --, therefor.

In column 17, line 53, in Claim 19, delete "$1.1 \times 10_{-7}$" and insert -- $1.1 \times 10^{-7}$ --, therefor.

In column 18, line 39, in Claim 25, delete "metal(1V)" and insert -- metal(IV) --, therefor.

In column 18, line 47, in Claim 27, delete "metal(JV)" and insert -- metal(IV) --, therefor.

Signed and Sealed this

Thirtieth Day of September, 2008

JON W. DUDAS
*Director of the United States Patent and Trademark Office*